United States Patent
Kuroki et al.

(10) Patent No.: US 8,030,835 B2
(45) Date of Patent: Oct. 4, 2011

(54) LIGHT EMITTING DEVICE

(75) Inventors: Toshihiro Kuroki, Fukuoka-ken (JP);
Yoshio Ariizumi, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 12/628,286

(22) Filed: Dec. 1, 2009

(65) Prior Publication Data

US 2011/0074276 A1    Mar. 31, 2011

(30) Foreign Application Priority Data

Sep. 25, 2009 (JP) ................. 2009-220339

(51) Int. Cl.
*H01J 1/62* (2006.01)
*H01L 33/00* (2010.01)

(52) U.S. Cl. ............ 313/483; 257/99; 257/98; 257/100; 313/512

(58) Field of Classification Search .......... 313/483–487, 313/512; 257/99, 81, 98, 100
See application file for complete search history.

(56) References Cited

U.S. PATENT DOCUMENTS 6,376,902 B1  4/2002  Arndt
7,242,032 B2  7/2007  Oshio

FOREIGN PATENT DOCUMENTS

| JP | 2001-518692 | 10/2001 |
|---|---|---|
| JP | 2002-314138 | 10/2002 |
| JP | 2002-374005 | 12/2002 |

*Primary Examiner* — Joseph L Williams
(74) *Attorney, Agent, or Firm* — Turocy & Watson, LLP (57) ABSTRACT

A light-emitting device includes: a first lead including a bonding region and a first outer edge extending generally parallel to a first direction; a light-emitting element bonded to the bonding region; a second lead including an electrical connection region connected to the light-emitting element; and a molded body including a first side surface generally perpendicular to the first direction, a second side surface provided on a side opposite to the first side surface and being generally perpendicular to the first direction, a lower surface, and a recess provided in a surface opposite to the lower surface, the molded body being formed so that one end portion of the first lead protrudes from the first side surface, the other end portion of the first lead and an end portion of the second lead each protrude from the second side surface, and the bonding region and the electrical connection region are exposed from a bottom surface of the recess. The one end portion of the first lead and the end portion of the second lead each are bent downward, the other end portion of the first lead are bent upward or downward, and a width of the first lead across the bonding region in a second direction perpendicular to the first direction are narrower than a width of the one end portion and wider than a width of the other end portion.

20 Claims, 9 Drawing Sheets

LIGHT EMITTING DEVICE

CROSS-REFERENCE TO RELATED APPLICATIONS

This application is based upon and claims the benefit of priority from the prior Japanese Patent Application No. 2009-220339, filed on Sep. 25, 2009; the entire contents of which are incorporated herein by reference.

BACKGROUND OF THE INVENTION

1. Field of the Invention

This invention relates to a light-emitting device.

2. Background Art

Light-emitting devices used in illumination and display devices and being capable of emitting visible light are often based on the surface-mounted device (SMD) structure which facilitates attachment to a circuit board.

In the SMD structure, a light-emitting element is bonded onto a lead frame exposed into a recess provided in a resin molded body. Furthermore, a sealing resin material is filled in the recess so as to cover the light-emitting element. The resin typically has a larger linear expansion coefficient than the lead frame made of a metal. Combined with the difference in material, this makes insufficient the adhesiveness therebetween.

Particularly for a light-emitting element with high power consumption, it is necessary to keep good heat dissipation while preventing delamination between the lead and the resin molded body.

JP-A 2001-518692 (Kohyou) discloses an example technique related to a surface-mounted light-emitting device. In this example, a plurality of external terminals protruding from a cover can be simultaneously mounted on a circuit board and are formed so as to protrude from a molded body as thermally conductive terminals.

However, even this example is not sufficient to keep good heat dissipation while preventing delamination between the lead and the resin molded body.

SUMMARY OF THE INVENTION

According to an aspect of the invention, there is provided a light-emitting device including: a first lead including a bonding region and a first outer edge extending generally parallel to a first direction; a light-emitting element bonded to the bonding region; a second lead including an electrical connection region connected to the light-emitting element; and a molded body including a first side surface generally perpendicular to the first direction, a second side surface provided on a side opposite to the first side surface and being generally perpendicular to the first direction, a lower surface, and a recess provided in a surface opposite to the lower surface, the molded body being formed so that one end portion of the first lead protrudes from the first side surface, the other end portion of the first lead and an end portion of the second lead each protrude from the second side surface, and the bonding region and the electrical connection region are exposed from a bottom surface of the recess, the one end portion of the first lead and the end portion of the second lead each being bent downward, the other end portion of the first lead being bent upward or downward, and a width of the first lead across the bonding region in a second direction perpendicular to the first direction being narrower than a width of the one end portion and wider than a width of the other end portion.

According to another aspect of the invention, there is provided a light-emitting device including: a first lead including a bonding region and a first outer edge extending generally parallel to a first direction; a light-emitting element bonded to the bonding region; a second lead including an electrical connection region connected to the light-emitting element; and a molded body including a first side surface generally perpendicular to the first direction, a second side surface provided on a side opposite to the first side surface and being generally perpendicular to the first direction, a lower surface, and a recess provided in a surface opposite to the lower surface, the molded body being formed so that one end portion of the first lead protrudes from the first side surface, the other end portion of the first lead and an end portion of the second lead protrude from the second side surface, and the bonding region and the electrical connection region are exposed from a bottom surface of the recess, the one end portion of the first lead, the other end portion of the first lead, and the end portion of the second lead having a generally equal length and each being bent downward, and a width of the first lead across the bonding region in a second direction perpendicular to the first direction being narrower than a width of the one end portion and wider than a width of the other end portion.

According to another aspect of the invention, there is provided a light-emitting device including: a first lead including a bonding region and a first outer edge extending generally parallel to a first direction; a light-emitting element bonded to the bonding region; a second lead including an electrical connection region connected to the light-emitting element; and a molded body including a first side surface generally perpendicular to the first direction, a second side surface provided on a side opposite to the first side surface and being generally perpendicular to the first direction, a lower surface, and a recess provided in a surface opposite to the lower surface, the molded body being formed so that one end portion of the first lead protrudes from the first side surface, the other end portion of the first lead and an end portion of the second lead protrude from the second side surface, and the bonding region and the electrical connection region are exposed from a bottom surface of the recess, the one end portion of the first lead being bent downward and further bifurcated, the other end portion of the first lead and the end portion of the second lead being bent downward, and a width of the first lead across the bonding region in a second direction perpendicular to the first direction being narrower than a width of the one end portion and wider than a width of the other end portion.

DETAILED DESCRIPTION OF THE INVENTION

Embodiments of the invention will now be described with reference to the drawings.

Figure 1A:
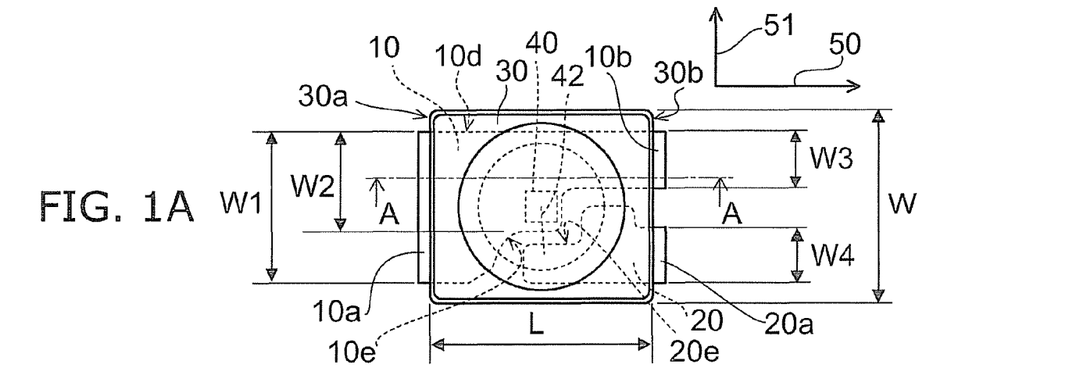
FIGS. 1A to 1D are schematic views of a light-emitting device according to a first embodiment.
Figure 1B:
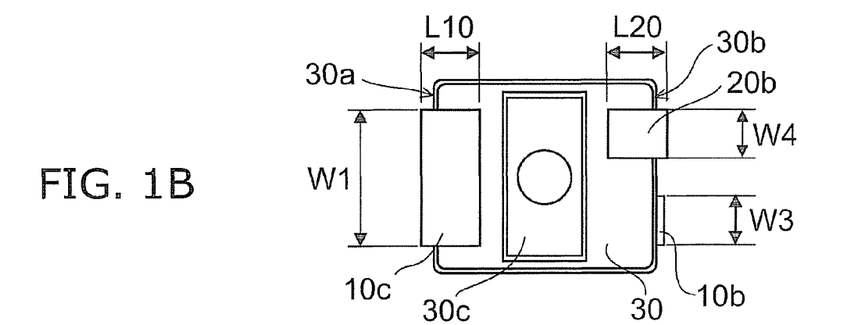
Figure 1C:
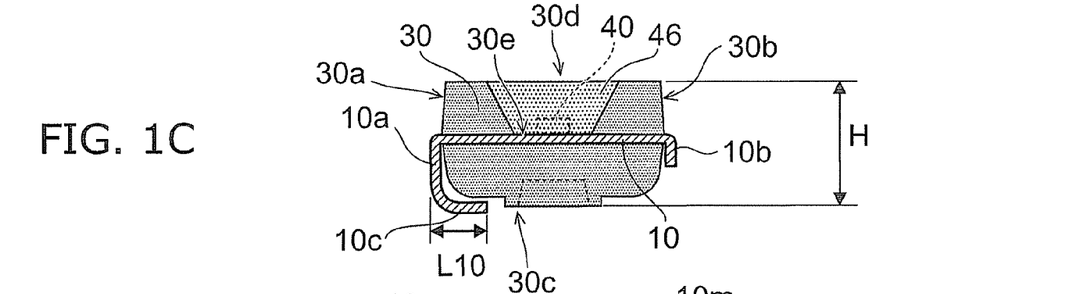
Figure 1D:
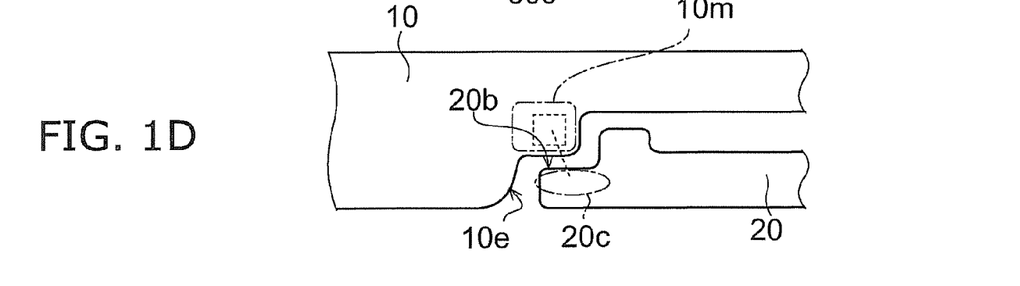

FIG. 1A is a schematic plan view of a light-emitting device according to a first embodiment, FIG. 1B is a schematic bottom view thereof, FIG. 1C is a schematic cross-sectional view taken along line A-A, and FIG. 1D is a schematic plan view of a lead frame near the bonding region of a light-emitting element.

This embodiment illustratively includes a light-emitting element 40, a molded body 30 made of a resin and the like, a sealing resin layer 36 filled in a recess 30d provided on the upper surface side of the molded body 30, a first lead 10, and a second lead 20. The light-emitting element 40 is bonded onto a bonding region 10m on the first lead 10 using a metal solder or conductive adhesive. Furthermore, an electrical connection region 20c on the second lead 20 is connected to one electrode of the light-emitting element 40 using a bonding wire 42 or the like.

The molded body 30 includes a first side surface 30a generally perpendicular to a first direction 50, a second side surface 30b provided on the side opposite to the first side surface 30a and being generally perpendicular to the first direction 50, a lower surface 30c, and a recess 30d provided on the upper surface side opposite to the lower surface 30c. One end portion 10a of the first lead 10 protruding from the first side surface 30a is bent downward, and the other end portion 10b of the first lead 10 protruding from the second side surface 30b is bent upward or downward. Furthermore, an end portion 20a of the second lead 20 protrudes from the second side surface 30b and is bent downward. Here, line A-A is generally parallel to the first direction 50.

The molded body 30 can be made of a thermoplastic resin. The material thereof can be a nylon-based resin such as polyphthalamide (PPA). Such a resin can be mixed with a filler having high reflectance, such as potassium titanate, so that light can be reflected upward at the sidewall and the bottom surface 30e of the recess 30d to increase the light extraction efficiency.

The molded body 30 is formed so that the bonding region 10m for the light-emitting element 40 on the first lead 10 and the electrical connection region 20c of the second lead 20 are exposed from the bottom surface 30e of the recess 30d. Furthermore, the sealing resin layer 46 is filled in the recess 30d so as to cover the light-emitting element 40.

The first lead 10 has a first outer edge 10d embedded in the molded body 30 so as to extend along the first direction 50 and a second outer edge 10e embedded in the molded body 30 so as to approach the first outer edge 10d toward the second side surface 30b.

In the following description, it is assumed that the width of the lead is measured along a second direction 51 generally perpendicular to the first direction 50. The width W1 of the one end portion 10a of the first lead 10 is wider than the width W3 of the other end portion 10b. Inside the molded body 30, the width of the first lead 10 is gradually narrowed toward the second side surface 30b. Its width W2 parallel to the second direction 51 across the bonding region 10m where the light-emitting element 40 is bonded is narrower than the width W1 of the one end portion 10a and wider than the width W3 of the other end portion 10b. The second outer edge 10e, as viewed from above, is shaped stepwise in this figure, but may be shaped like an oblique line or curved line as long as the width is gradually narrowed.

The lead frame can be made of an iron-based or copper-based alloy. The copper-based alloy is more preferable because it can reduce thermal resistance. A coating can be applied to the surface of the lead frame to increase optical reflectance, and solder bonding strength to the circuit board. Such a coating can illustratively be made of Ag, or a Ni/Pd/Au stacked structure.

Furthermore, as shown in FIG. 1D, the second lead 20 has an outer edge 20b embedded in the molded body 30 so as to face the second outer edge 10e near the bonding region 10m of the first lead 10 where the light-emitting element 40 is bonded. The outer edge 20b of the second lead 20 shaped stepwise as viewed from above is spaced by a prescribed distance from the second outer edge 10e of the first lead 10. This configuration is preferable because it can ensure electrical insulation and improve the bite between the lead and the molded body by increasing the contact area between the outer edge of the lead frame and the molded body.

Furthermore, as shown in FIG. 1A, the width W1 of the one end portion 10a of the first lead 10 is closed to the width W of the first side surface 30a. Thus, heat generated in the light-emitting element 40 is dissipated to a heat dissipation plate from the one end portion 10a having the wide width W1 on the first side surface 30a side and the other end portion 10b having the width W3 on the second side surface 30b side, and hence the thermal resistance can be reduced. That is, the thermal resistance can be reduced without increasing the outline size of the light-emitting device.

The surface-mounted package like this is referred to as PLCC (plastic leaded chip carrier). With regard to its outline, for instance, the length (L) is 3.2 mm, the width (W) is 2.9 mm, and the height (H) is 1.9 mm. A PLCC device can be attached using a dedicated socket, or directly soldered to a circuit board. Furthermore, the width W1 of the one end portion 10a of the first lead 10 can be 2.2 mm, and the thickness of the first lead 10 and the second lead 20 can be 0.1 mm, achieving a small package.

In the light-emitting element, an InGaAlP-based material represented by a composition formula $In_x(Ga_yAl_{1-y})_{1-x}P$ ($0 \leq x \leq 1, 0 \leq y \leq 1$) can be used to emit light in the green to red wavelength range. Alternatively, an InGaAlN-based material represented by a composition formula $In_xGa_yAl_{1-x-y}N$ ($0 \leq x \leq 1, 0 \leq y \leq 1, x+y \leq 1$) can be used to emit light in the ultraviolet to green wavelength range. Here, the material based on $In_x(Ga_yAl_{1-y})_{1-x}P$ and $In_xGa_yAl_{1-x-y}N$ may contain p-type or n-type dopant.

For emission of blue light, the recess 30d can be illustratively filled with a silicone resin mixed with yellow phosphor particles made of a silicate material to obtain yellow light as wavelength-converted light. Thus, white light and an incandescent color can be obtained as mixed light of yellow light and blue light.

Figure 2A:
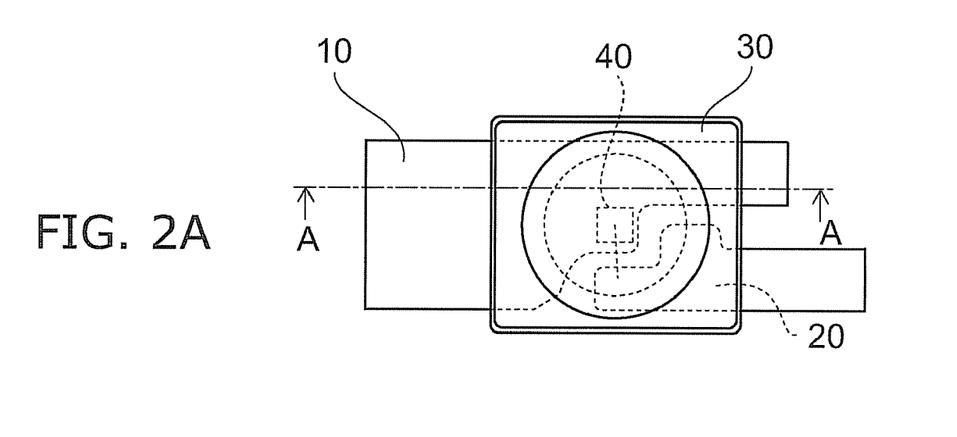
FIGS. 2A, 2B, and 2C are schematic views illustrating lead pull-out.
Figure 2B:
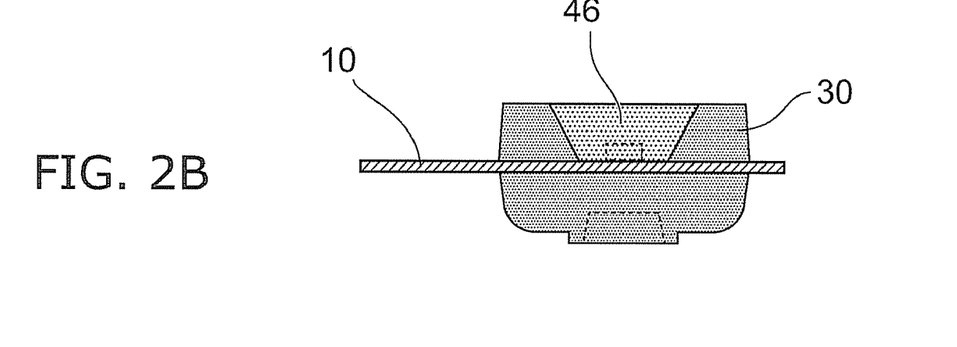
Figure 2C:
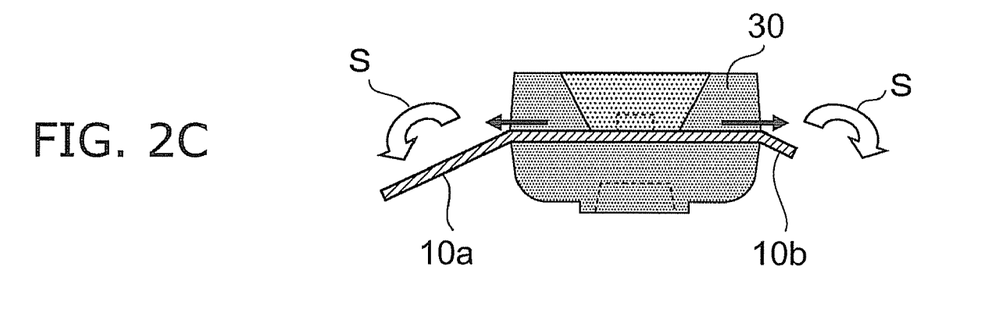

FIGS. 2A, 2B, and 2C are schematic views illustrating lead pull-out in the lead bending step.

The schematic plan view of FIG. 2A and the schematic cross-sectional view of FIG. 2B show the structure after the resin molding step, where the first lead 10 protrudes along the first direction 50.

FIG. 2C shows the step of bending downward the one end portion 10a and the other end portion 10b. If the other end portion 10b has no protruding bent portion, the bending stress S and thermal stress due to the difference in linear expansion coefficient may cause the first lead 10 to be easily delaminated from the molded body 30 and pulled out in the direction of the arrow. In this embodiment, a protruding bent portion is formed on each of the first and second side surfaces 30a, 30b side. Thus, the stress acts in opposite directions along line A-A, and lead pull-out can be prevented. Here, the other end portion 10b may be bent upward.

The linear expansion coefficient is approximately $1.7 \times 10^{-5}/°$ C. for copper and approximately $1.2 \times 10^{-5}/°$ C. for iron, but approximately $6.3 \times 10^{-5}/°$ C. for epoxy resin. Thus, the linear expansion coefficient of the resin is several times larger than that of copper. This generates large thermal stress during temperature rise and fall in the soldering step, which may cause delamination.

Next, as shown in FIGS. 1B and 1C, one end portion 10b of the first lead 10 and the end portion 20b of the second lead 20 bent downward are further bent to below the lower surface 30c of the molded body 30 to form attachment regions 10c, 20b, respectively. This bending can be performed so that the lower surface of these attachment regions 10c, 20b is generally coplanar with or lower than the lower surface 30c of the molded body 30. Then, soldering onto a circuit board can be reliably performed by a reflow process and the like. In this case, the length L10 of the attachment region 10c of the first lead 10 along the first direction 50 and the length L20 of the second lead 20 along the first direction 50 can illustratively be 0.8 mm.

Figure 3A:
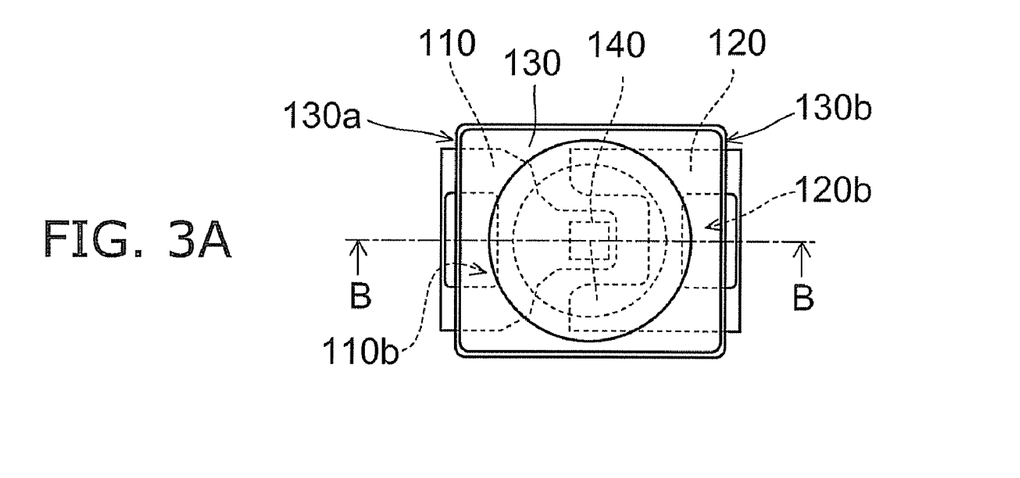
FIGS. 3A to 3B are schematic views of a light-emitting device according to a comparative example.
Figure 3B:
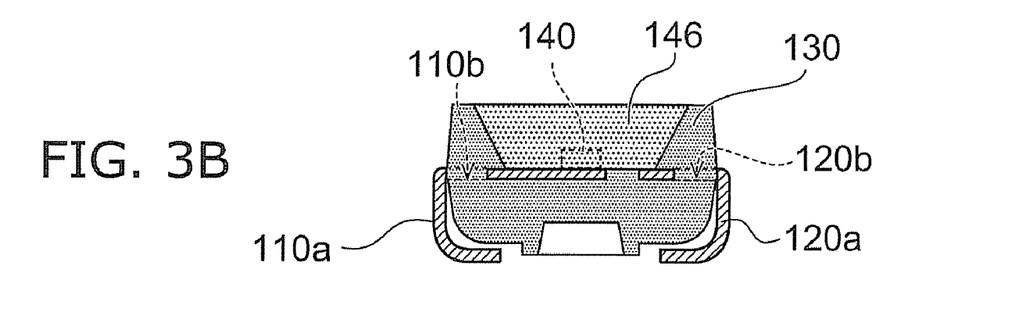

FIG. 3A is a schematic plan view of a light-emitting device according to a comparative example, and FIG. 3B is a schematic cross-sectional view taken along line B-B.

The first lead 110 and the second lead 120 have end portions opposed to each other inside a molded body 130. The first lead 110 with a light-emitting element 140 bonded thereto is bifurcated inside the molded body 130, and each bifurcated portion protrudes outside from a first side surface 130a. Furthermore, the second lead 120 electrically connected to the light-emitting element 140 by wire bonding protrudes outside from a second side surface 130b of the molded body 130. In this comparative example, the first lead 110 protrudes only from the first side surface 130a.

If the lead thus protrudes only from one side surface of the molded body made of a resin, simply expanding the width of the lead tends to cause lead pull-out and delamination from the molded body due to bending stress and thermal stress. An anchor hole with a large area as provided in the comparative example can prevent lead pull-out and delamination from the molded body. However, it narrows the effective width of the first and second leads 110, 120 and increases thermal resistance. Consequently, the operating temperature of the light-emitting element 140 increases, making it difficult to achieve high output power.

In contrast, this embodiment can prevent pull-out and delamination of the lead from the molded body 30. This facilitates expanding the effective width of the first lead 10 to which the light-emitting element 40 is bonded, and the thermal resistance can be reduced. That is, high output power can be achieved.

Figure 4A:
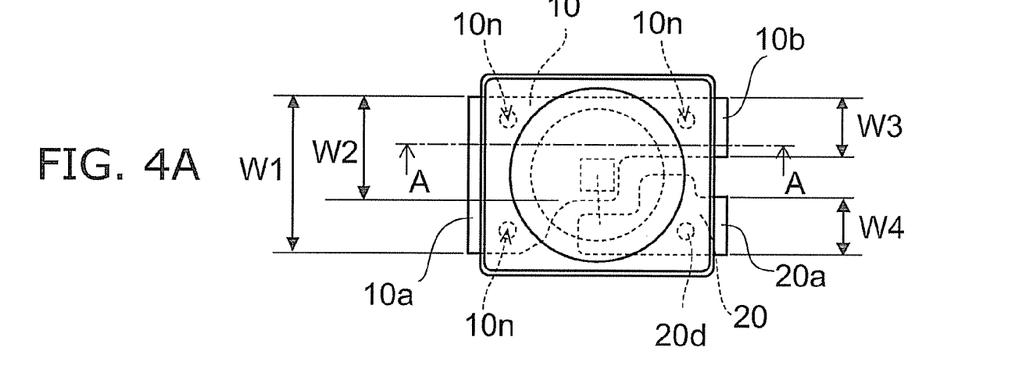
FIGS. 4A to 4D are schematic views of a variation of the first embodiment.
Figure 4B:
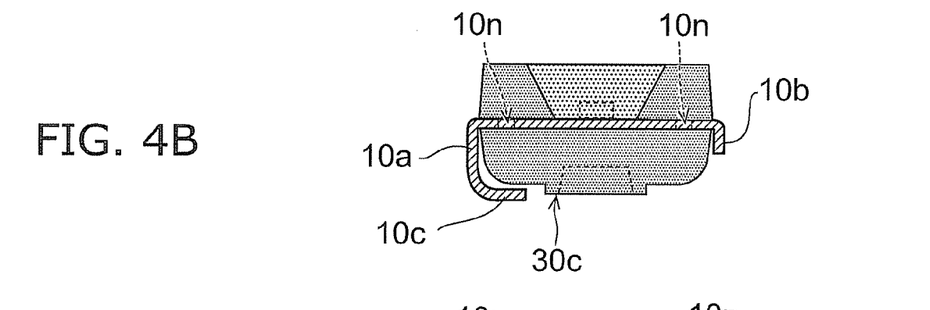
Figure 4C:
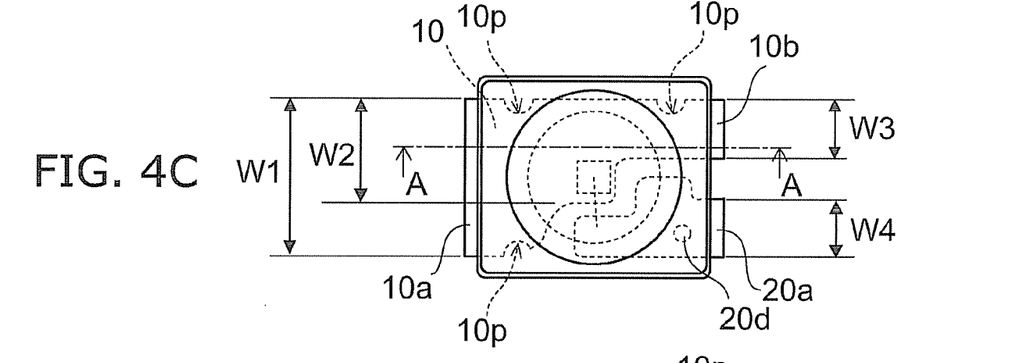
Figure 4D:
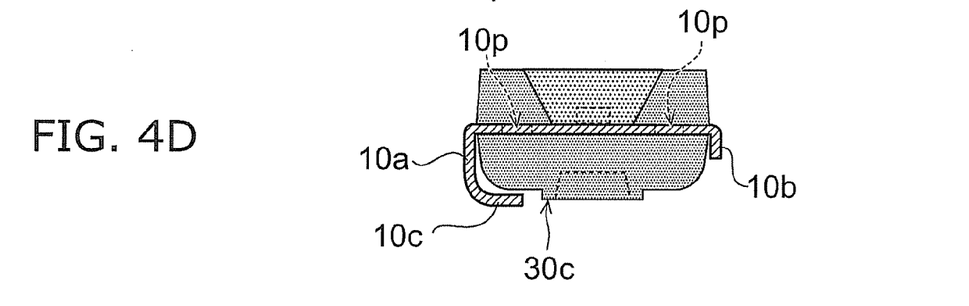

FIG. 4A is a schematic plan view of a first variation of the first embodiment, FIG. 4B is a schematic cross-sectional view taken along line A-A, FIG. 4C is a schematic plan view of a second variation, and FIG. 4D is a schematic cross-sectional view taken along line A-A.

As in the first variation shown in FIGS. 4A and 4B, the first lead 10 and the second lead 20 may have anchor holes. The molded body 30 penetrates through three round holes 10n of the first lead 10 and a round hole 20d of the second lead 20. Thus, the round holes 10n, 20d serve as anchor holes. That is, the anchor hole prevents loosening between the lead and the molded body, increases adhesion strength, and increases the contact area. This can avoid delamination between the lead and the molded body and prevent lead pull-out even under stress in the bending step and thermal stress.

Also in this case, the width of the first lead 10 can be expanded, which further facilitates reducing thermal resistance. The round hole or square hole operable as an anchor hole can be smaller than the width W1 of the first lead 10 so as not to interfere with the reduction of thermal resistance. Furthermore, part of the small anchor hole may be exposed on the first side surface 30a of the molded body 30. The width W1 can be easily made larger than the width W2 even if the width of the small anchor hole is subtracted from the width W1. In this case, it is possible to further increase adhesion strength while maintaining low thermal resistance.

The anchor hole may be shaped like a square or rectangular hole instead of the round hole. Furthermore, as in the second variation shown in FIGS. 4C and 4D, for instance, it is also possible to use a notch 10p provided on each outer edge 10d, 10e of the first lead 10.

Figure 5A:
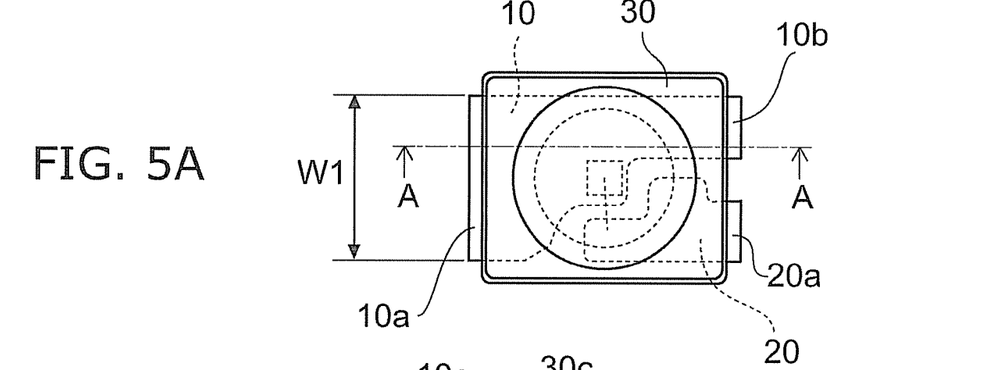
FIGS. 5A to 5D are schematic views of a light-emitting device according to a second embodiment.
Figure 5B:
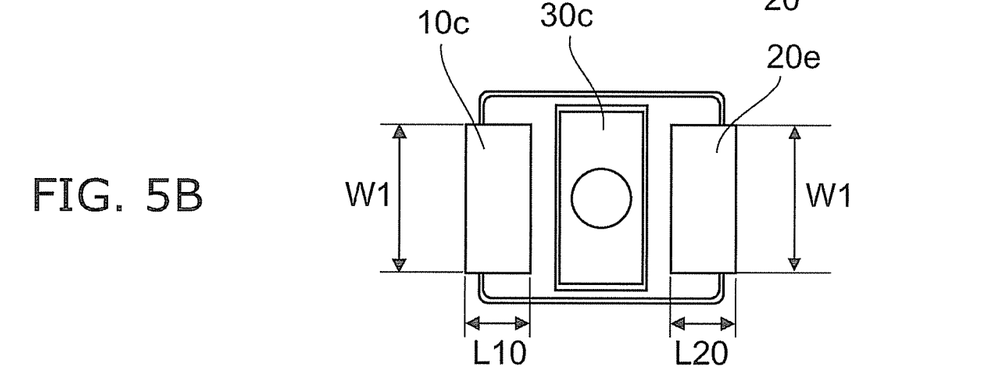
Figure 5C:
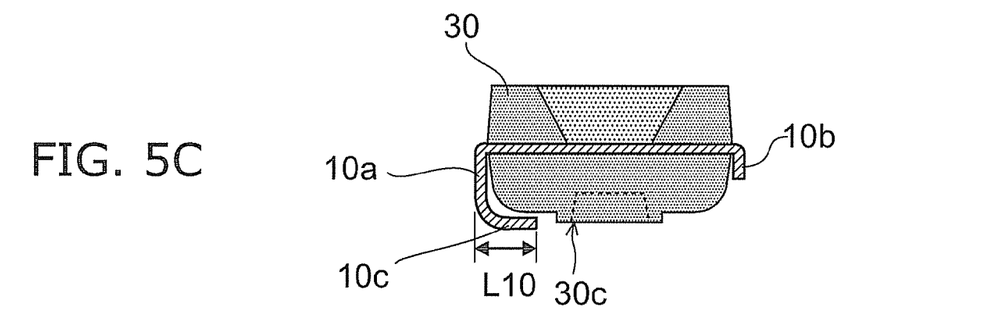
Figure 5D:
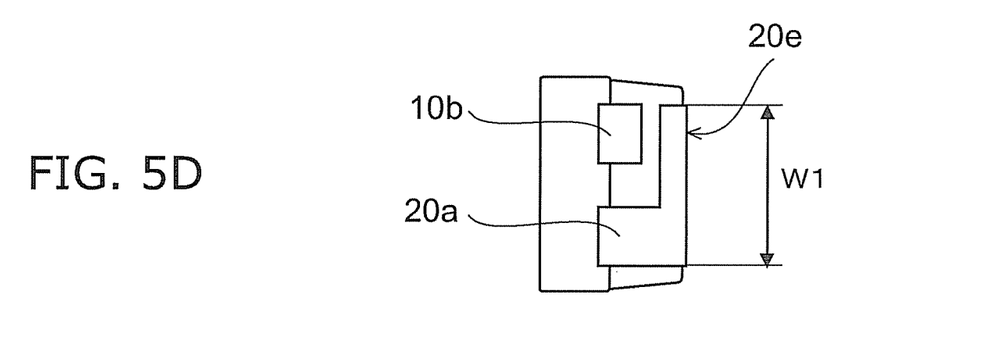

FIG. 5A is a schematic plan view of a light-emitting device according to a second embodiment, FIG. 5B is a schematic bottom view thereof, FIG. 5C is a schematic cross-sectional view taken along line A-A, and FIG. 5D is a schematic side view on the second side surface side.

The second lead 20 protruding from the second side surface 30b of the molded body 30 is bent downward along the first and second side surfaces 30a, 30b of the molded body 30, and further bent toward the lower surface 30c. In this case, the end portion 20a of the second lead 20 protrudes from the second side surface 30b with a width narrower than the width W1 of the first lead 10, and expands its width while being bent downward. More specifically, the width of the second lead 20 parallel to the second direction 51 is expanded so as to be generally equal to the width W1 of the first lead 10, thereby forming an attachment region 20e which is further bent toward the lower surface 30c of the molded body 30. In this case, as shown in FIG. 5B, in relation to the circuit board, the attachment region 20c and the attachment region 10c can have a generally symmetrical shape with respect to a line parallel to the second direction 51 so that soldering to a circuit board can be performed with good balance.

Figure 6A:
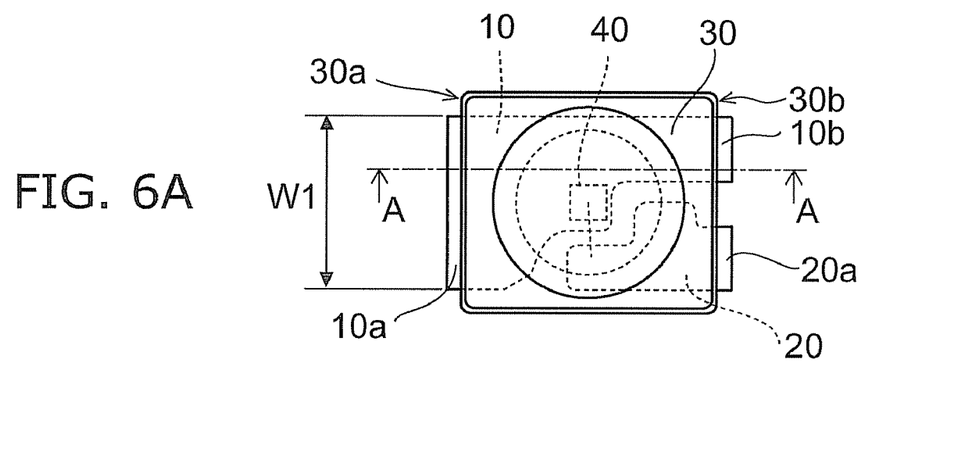
FIGS. 6A to 6C are schematic views of a light-emitting device according to a third embodiment.
Figure 6B:
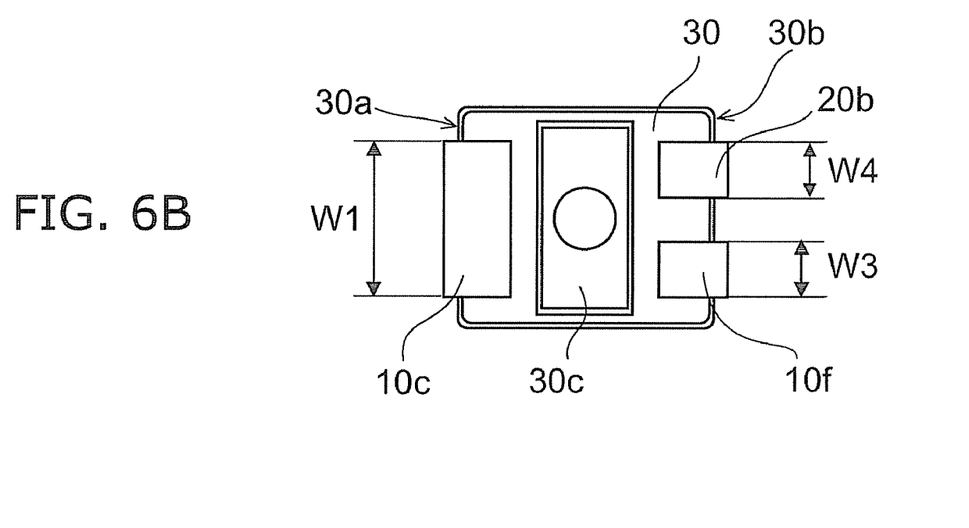
Figure 6C:
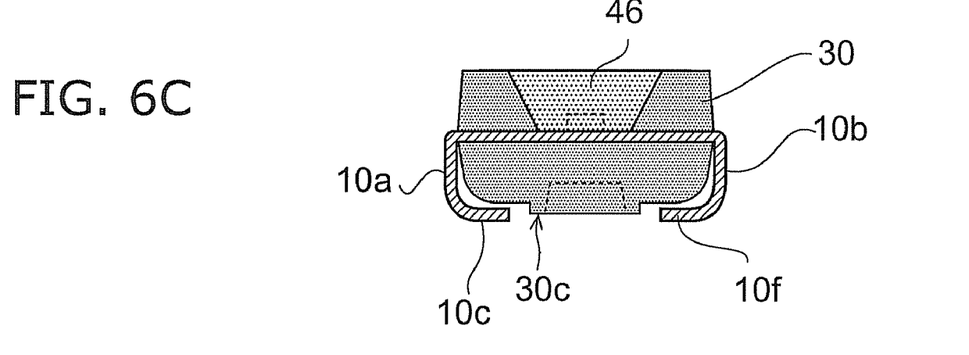

FIG. 6A is a schematic plan view of a light-emitting device according to a third embodiment, FIG. 6B is a schematic bottom view thereof, and FIG. 6C is a schematic cross-sectional view taken along line A-A.

The other end portion 10b of the first lead 10 is further bent downward along the second side surface 30b to form an attachment region 10f. The width W3 of the attachment region 10f of the first lead 10 can be generally equal to the width W4 of the attachment region 20b of the second lead 20 so that soldering to a circuit board can be performed with good balance.

Figure 7A:
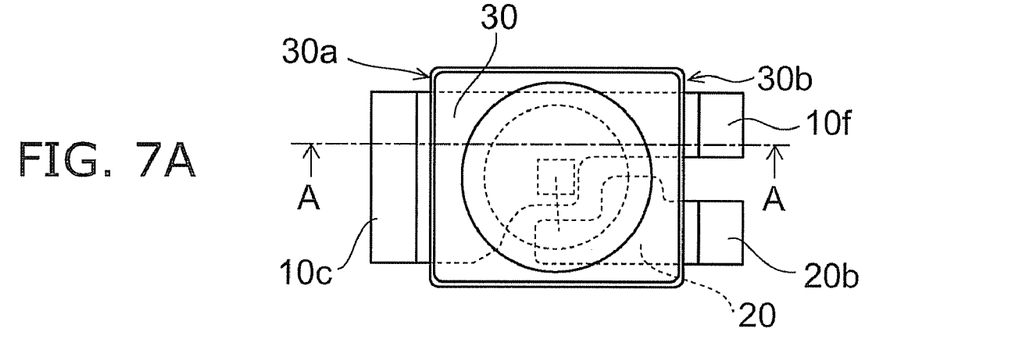
FIGS. 7A to 7C are schematic views of a variation of the third embodiment.
Figure 7B:
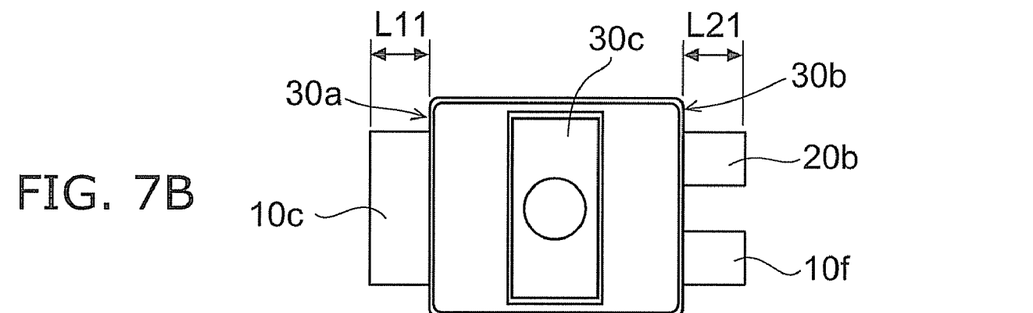
Figure 7C:
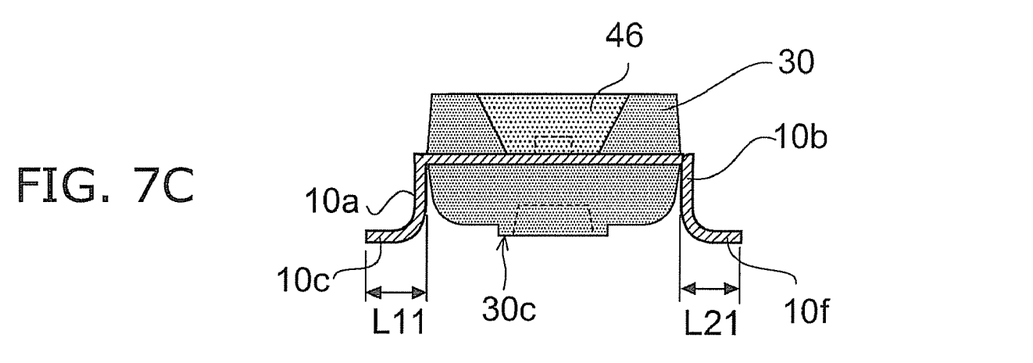

FIG. 7A is a schematic plan view of a variation of the third embodiment, FIG. 7B is a schematic bottom view thereof, and FIG. 7C is a schematic side view thereof.

The first lead 10 may be bent outward from the first side surface 30a of the molded body 30 to form an attachment region 10c with length L11 along the first direction 50. Furthermore, the first lead 10 may be bent outward from the second side surface 30b of the molded body 30 to form an attachment region 20b with length L21 along the first direction 50, and the second lead 20 may be bent outward from the second side surface 30b to form an attachment region 10f with length L21 along the first direction 50. This facilitates attachment to a circuit board and visual inspection. The lengths of the attachment regions, L11 and L21, can be made generally equal so that soldering can be performed with good left-right balance.

Figure 8A:
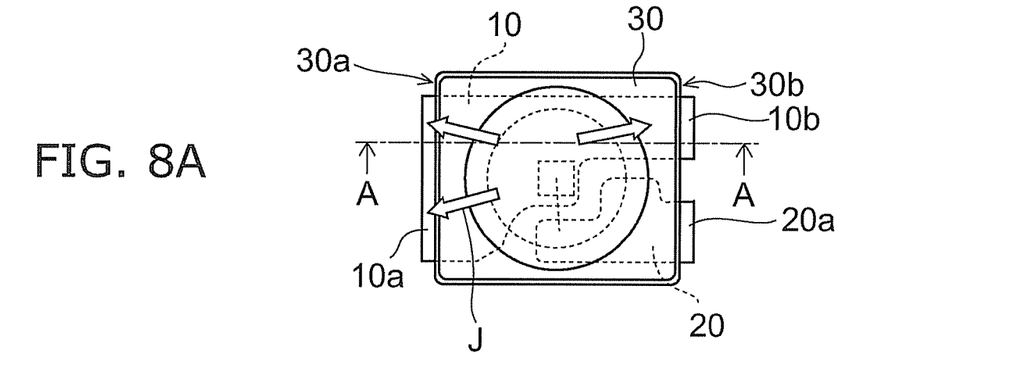
FIGS. 8A to 8D are schematic views of a light-emitting device according to a fourth embodiment.
Figure 8B:
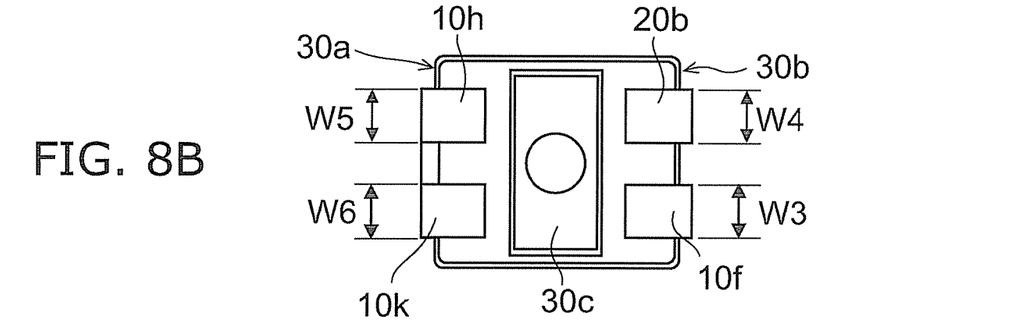
Figure 8C:
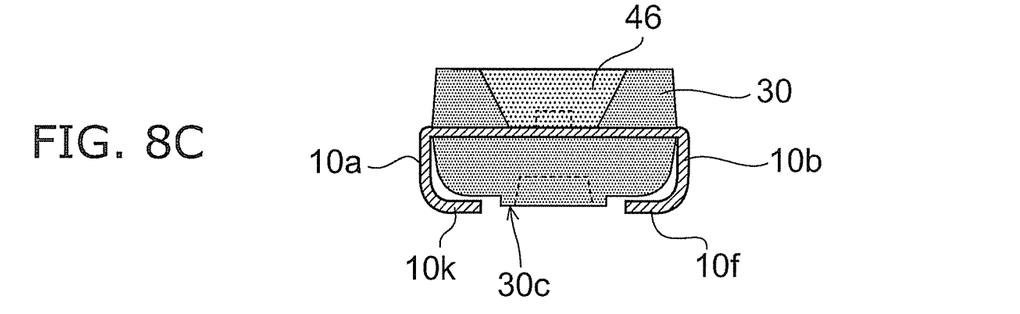
Figure 8D:
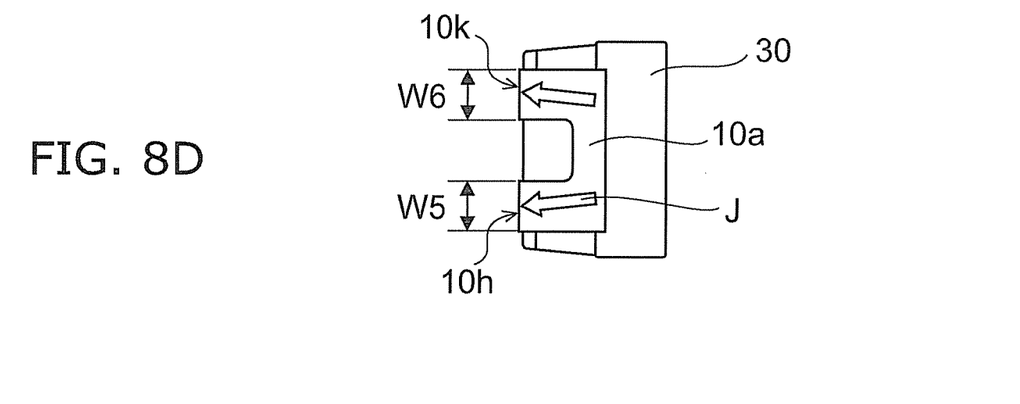

FIG. 8A is a schematic plan view of a light-emitting device according to a fourth embodiment, FIG. 8B is a schematic bottom view thereof, FIG. 8C is a schematic cross-sectional view taken along line A-A, and FIG. 8D is a schematic side view on the first side surface side.

One end portion 10a protruding from the first side surface 30a of the molded body 30 is bent and further bifurcated. The two bifurcated end portions are further bent toward the lower surface 30c to form attachment regions 10h, 10k. This causes little variation in the distribution of heat flow J because the area of the first lead 10 does not change inside the molded body 30. Thus, the thermal resistance can be left substantially unchanged even if the first lead 10 is bifurcated outside.

Furthermore, as shown in FIG. 8B, the shape of the attachment regions 10f, 10h, 10k of the first lead 10 and the attachment region 20b of the second lead 20 can be made generally the same and placed at generally symmetrical positions with respect to a line parallel to the first direction 50 and a line parallel to the second direction 51. Then, in soldering to a circuit board by a reflow process, the surface tension of solder is applied with good balance. Imbalance in surface tension or imbalance in the melting condition of solder due to an asymmetrical pattern, if any, may cause mounting failure due to the Manhattan phenomenon (or tombstone phenomenon) in which the surface-mounted device rises up due to increased bonding force of solder on one side. This embodiment prevents such mounting failure and enables reliable bonding to a circuit board.

Figure 9A:
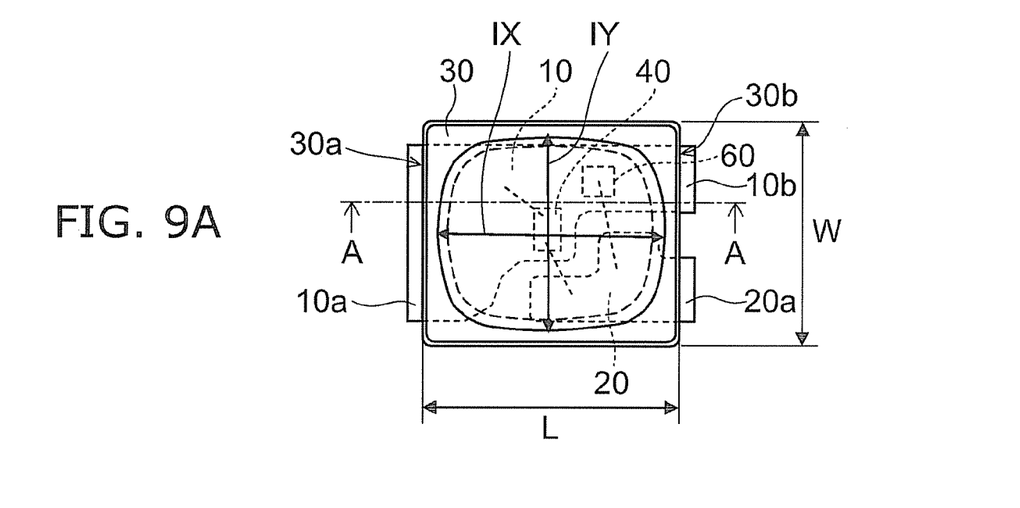
FIGS. 9A to 9C are schematic views of a light-emitting device according to a fifth embodiment.
Figure 9B:
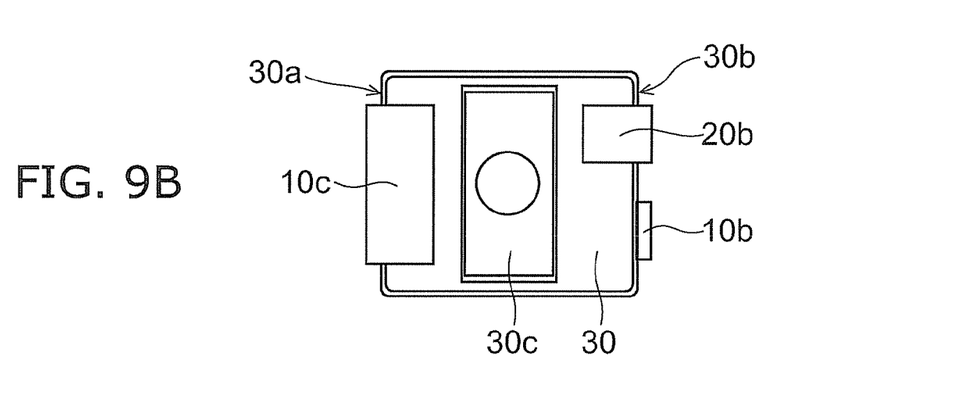
Figure 9C:
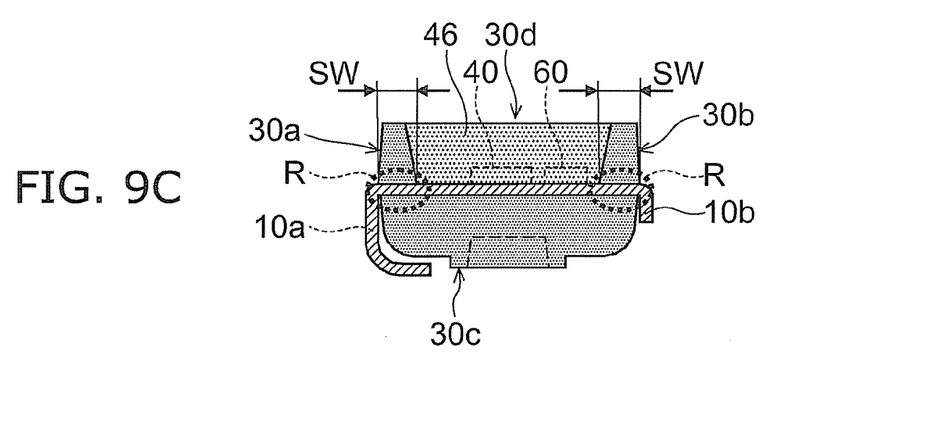

FIG. 9A is a schematic plan view of a light-emitting device according to a fifth embodiment, FIG. 9B is a schematic bottom view thereof, and FIG. 9C is a schematic cross-sectional view taken along line A-A.

The light-emitting element 40 is made of an InGaAlN-based material. Yellow phosphor particles made of a silicate material can be dispersed in the sealing resin layer 46 to absorb the light emitted from the light-emitting element 40 and emit wavelength-converted light with a wavelength around yellow. Thus, white light and an incandescent color can be obtained as mixed light of blue light and yellow light, for instance. Here, three or more lights can be mixed using phosphor particles from which visible light in the green to red wavelength range can be emitted as the wavelength-converted light.

Furthermore, an ESD (electrostatic discharge) protection element 60 such as a Zener diode can be placed in the recess 30d so as to be opposite in polarity to the light-emitting element 40. This can increase ESD withstand capability. In this case, the width SW of the sidewall of the molded body 30 can be narrowed to increase the volume of the recess 30d and facilitate placing the ESD protection element 60 therein while keeping small the planar size of the light-emitting device. However, if the width SW of the sidewall is narrowed, the adhesion strength between the molded body 30 and the first lead 10 with the width W1 expanded to reduce thermal resistance is likely to decrease near the region R shown by the dashed line.

In this embodiment, for instance, while the length L of the molded body 30 is 3.2 mm, the inner diameter IX of the recess 30d at the upper surface can be as large as 2.84 mm. In this case, because the sidewall of the recess 30d is expanded upward, the width SW of the sidewall is illustratively 0.3 mm. Furthermore, while the width W of the molded body 30 is 2.9 mm, the inner diameter IY of the recess 30d at the upper surface can be as large as 2.54 mm.

In this embodiment, the first lead 10 is bent in the state of protruding from each of the first side surface 30a and the second side surface 30b. Thus, the stress is relaxed by acting in opposite directions. Hence, it is possible to prevent, for instance, lead pull-out as well as cracking and delamination of the molded body 30 near the region R. Thus, the fifth embodiment can provide a white light-emitting device including an ESD protection element to increase ESD withstand capability.

The light-emitting device according to the first to fifth embodiments and the associated variations can emit light in the blue to red visible wavelength range. The light-emitting device according to the present embodiments, which exhibits low thermal resistance and can be attached to a circuit board with good balance while maintaining a small size, can be used as a backlight source of a display device, and a pilot lamp.

The embodiments of the invention have been described with reference to the drawings. However, the invention is not limited to these embodiments. Those skilled in the art can variously modify the material, size, shape, layout and the like of the light-emitting element, lead frame, and molded body constituting the embodiments of the invention, and such modifications are also encompassed within the scope of the invention as long as they do not depart from the spirit of the invention.

The invention claimed is:

1. A light-emitting device comprising:
a first lead including a bonding region and a first outer edge extending generally parallel to a first direction;
a light-emitting element bonded to the bonding region;
a second lead including an electrical connection region connected to the light-emitting element; and
a molded body including a first side surface generally perpendicular to the first direction, a second side surface provided on a side opposite to the first side surface and being generally perpendicular to the first direction, a lower surface, and a recess provided in a surface opposite to the lower surface, the molded body being formed so that one end portion of the first lead protrudes from the first side surface, the other end portion of the first lead and an end portion of the second lead each protrude from the second side surface, and the bonding region and the electrical connection region are exposed from a bottom surface of the recess,
the one end portion of the first lead and the end portion of the second lead each being bent downward,
the other end portion of the first lead being bent upward or downward, and
a width of the first lead across the bonding region in a second direction perpendicular to the first direction being narrower than a width of the one end portion and wider than a width of the other end portion.

2. The device according to claim 1, wherein
the first lead includes a second outer edge embedded in the molded body and approaching the first outer edge toward the second side surface, and
the second lead includes an outer edge embedded in the molded body so as to face the second outer edge near the bonding region of the first lead.

3. The device according to claim 2, wherein the second outer edge of the first lead includes a stepped portion as viewed from above.

4. The device according to claim 3, wherein an outer edge of the bonding region for the light-emitting element constitutes the stepped portion.

5. The device according to claim 4, wherein the second lead includes an outer edge opposed to the stepped portion across the molded body.

6. The device according to claim 1, wherein the one end portion of the first lead and the end portion of the second lead each include an attachment region which is bent toward the lower surface side so as to be generally coplanar with or lower than the lower surface.

7. The device according to claim 6, wherein the end portion of the second lead is narrower than the width of the one end portion of the first lead in its protruding portion from the second side surface, and is expanded in the attachment region to have the same width as the one end portion.

8. The device according to claim 7, wherein the attachment region of the first lead and the attachment region of the second lead are symmetric with respect to a line parallel to the second direction.

9. The device according to claim 1, wherein the one end portion and the end portion of the second lead each include an attachment region which is further bent outward from the molded body.

10. The device according to claim 1, wherein the first lead embedded inside the molded body includes at least an anchor hole.

11. The device according to claim 1, further comprising:
a sealing resin layer filled in the recess so as to cover the light-emitting element.

12. The device according to claim 11, wherein the sealing resin layer is mixed with phosphor particles which can absorb emitted light from the light-emitting element and emit wavelength-converted light.

13. A light-emitting device comprising:
a first lead including a bonding region and a first outer edge extending generally parallel to a first direction;
a light-emitting element bonded to the bonding region;
a second lead including an electrical connection region connected to the light-emitting element; and
a molded body including a first side surface generally perpendicular to the first direction, a second side surface provided on a side opposite to the first side surface and being generally perpendicular to the first direction, a lower surface, and a recess provided in a surface opposite to the lower surface, the molded body being formed so that one end portion of the first lead protrudes from the first side surface, the other end portion of the first lead and an end portion of the second lead protrude from the second side surface, and the bonding region and the electrical connection region are exposed from a bottom surface of the recess,
the one end portion of the first lead, the other end portion of the first lead, and the end portion of the second lead having a generally equal length and each being bent downward, and
a width of the first lead across the bonding region in a second direction perpendicular to the first direction being narrower than a width of the one end portion and wider than a width of the other end portion.

14. The device according to claim 13, wherein the one end portion of the first lead, the other end portion of the first lead, and the end portion of the second lead each include an attachment region which is bent toward the lower surface side so as to be generally coplanar with or lower than the lower surface.

15. The device according to claim 13, wherein the width of the other end portion of the first lead is generally equal to a width of the end portion of the second lead.

16. The device according to claim 13, wherein the first lead embedded inside the molded body includes at least an anchor hole.

17. A light-emitting device comprising:
a first lead including a bonding region and a first outer edge extending generally parallel to a first direction;
a light-emitting element bonded to the bonding region;
a second lead including an electrical connection region connected to the light-emitting element; and
a molded body including a first side surface generally perpendicular to the first direction, a second side surface provided on a side opposite to the first side surface and being generally perpendicular to the first direction, a lower surface, and a recess provided in a surface opposite to the lower surface, the molded body being formed so that one end portion of the first lead protrudes from the first side surface, the other end portion of the first lead and an end portion of the second lead protrude from the second side surface, and the bonding region and the electrical connection region are exposed from a bottom surface of the recess,
the one end portion of the first lead being bent downward and further bifurcated,
the other end portion of the first lead and the end portion of the second lead being bent downward, and
a width of the first lead across the bonding region in a second direction perpendicular to the first direction being narrower than a width of the one end portion and wider than a width of the other end portion.

18. The device according to claim 17, wherein the bifurcated one end portion of the first lead, the other end portion of the first lead, and the end portion of the second lead respectively include four attachment regions which are bent toward the lower surface side so as to be generally coplanar with or lower than the lower surface.

19. The device according to claim 18, wherein the four attachment regions are symmetric with respect to each of a line parallel to the first direction and a line parallel to the second direction.

20. The device according to claim 17, wherein the first lead embedded inside the molded body includes at least an anchor hole.

* * * * *